(12) United States Patent
Naviasky et al.

(10) Patent No.: US 10,193,555 B1
(45) Date of Patent: Jan. 29, 2019

(54) METHODS AND DEVICES FOR A MEMORY INTERFACE RECEIVER

(71) Applicant: Cadence Design Systems, Inc., San Jose, CA (US)

(72) Inventors: Eric Harris Naviasky, Ellicott City, MD (US); Thomas Evan Wilson, Laurel, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 71 days.

(21) Appl. No.: 15/197,324

(22) Filed: Jun. 29, 2016

(51) Int. Cl.
| | |
|---|---|
| *G06F 17/50* | (2006.01) |
| *H03K 19/0948* | (2006.01) |
| *G11C 14/00* | (2006.01) |
| *H03F 1/30* | (2006.01) |
| *G11C 11/412* | (2006.01) |
| *H03K 17/687* | (2006.01) |

(52) U.S. Cl.
CPC ..... *H03K 19/0948* (2013.01); *G06F 17/5054* (2013.01); *G11C 14/0009* (2013.01); *G11C 11/412* (2013.01); *H03F 1/301* (2013.01); *H03K 17/6872* (2013.01)

(58) Field of Classification Search
CPC ...... G06F 17/5054; H03F 1/301; H03F 1/308; G11C 7/1006; G11C 11/4091; G11C 11/412; G11C 14/0009; H03K 17/6872; H03K 19/0948
See application file for complete search history.

(56) References Cited

U.S. PATENT DOCUMENTS

| | | | | |
|---|---|---|---|---|
| 4,959,816 | A * | 9/1990 | Iwahashi | G11C 7/1006 365/185.17 |
| 5,493,533 | A * | 2/1996 | Lambrache | G11C 7/067 365/175 |
| 5,864,416 | A * | 1/1999 | Williams | H03F 3/082 330/278 |
| 6,054,705 | A * | 4/2000 | Carroll | G01N 23/083 250/214 A |
| 6,331,802 | B1 * | 12/2001 | Kim | H03G 7/06 330/133 |
| 6,344,992 | B1 * | 2/2002 | Nakamura | G11C 5/147 365/154 |
| 6,373,275 | B1 * | 4/2002 | Otsuka | G06F 13/4086 326/30 |
| 6,377,084 | B1 * | 4/2002 | Forbes | H03K 3/356113 327/103 |

(Continued)

*Primary Examiner* — Helen Rossoshek
(74) *Attorney, Agent, or Firm* — Schwegman Woessner & Woessner, P.A.

(57) ABSTRACT

Embodiments relate to systems, methods and computer readable media to enable design and creation of receiver circuitry One embodiment is a receiver apparatus comprising a first resistor connected to a first receiver input, a first N-type metal oxide semiconductor (NMOS) field effect transistor (FET), a second NMOS FET, a trans-impedance amplifier wherein an input terminal of the trans-impedance amplifier is connected to a drain terminal of the second NMOS FET, and a complementary metal oxide semiconductor (CMOS) logic gate. Additional embodiments including other circuitry, associated methods, and media comprising instructions associated with generation of circuit design files are also described.

20 Claims, 6 Drawing Sheets

(56) References Cited

U.S. PATENT DOCUMENTS

| | | | | |
|---|---|---|---|---|
| 6,717,474 | B2* | 4/2004 | Chen | H03F 3/45206 330/253 |
| 6,876,259 | B2* | 4/2005 | Visocchi | H03F 3/08 250/214 A |
| 6,999,745 | B2* | 2/2006 | Leenaerts | H04B 1/30 327/102 |
| 7,075,370 | B2* | 7/2006 | Youngblood | H03F 3/4508 330/255 |
| 7,263,342 | B2* | 8/2007 | Bagheri | H03F 3/193 455/283 |
| 7,286,019 | B2* | 10/2007 | Peng | H03F 1/30 330/285 |
| 7,457,605 | B2* | 11/2008 | Thompson | H03D 7/1441 455/285 |
| 7,702,293 | B2* | 4/2010 | Ruha | H04L 25/0264 455/78 |
| 7,948,294 | B2* | 5/2011 | Wu | H03D 7/1441 327/355 |
| 8,222,877 | B2* | 7/2012 | Cerchi | G05F 1/565 323/282 |
| 8,319,553 | B1* | 11/2012 | Ivanov | H03F 1/223 330/253 |
| 8,407,558 | B2* | 3/2013 | Abbasfar | G06F 11/1004 714/755 |
| 8,761,707 | B1* | 6/2014 | Connell | H03F 3/45188 455/293 |
| 8,810,319 | B1* | 8/2014 | Chan | H03F 1/42 330/253 |
| 9,755,680 | B2* | 9/2017 | Zhu | H04B 1/1638 |
| 9,767,888 | B1* | 9/2017 | Ravi | G11C 11/4074 |
| 2003/0224624 | A1* | 12/2003 | Gay | G05F 3/242 438/800 |
| 2006/0227896 | A1* | 10/2006 | Kiamilev | H04L 25/0274 375/297 |
| 2007/0250735 | A1* | 10/2007 | Momii | H03L 7/08 713/500 |
| 2008/0230683 | A1* | 9/2008 | Uo | H03F 3/087 250/214 A |
| 2009/0034658 | A1* | 2/2009 | Lu | H04L 27/06 375/320 |
| 2012/0021713 | A1* | 1/2012 | Mikhemar | H04B 1/18 455/341 |
| 2014/0171006 | A1* | 6/2014 | Murphy | H04B 15/06 455/296 |
| 2016/0134240 | A1* | 5/2016 | Subramaniyan | H03F 1/301 327/560 |
| 2017/0187405 | A1* | 6/2017 | Sen | H04B 1/1027 |

* cited by examiner

US 10,193,555 B1

METHODS AND DEVICES FOR A MEMORY INTERFACE RECEIVER

TECHNICAL FIELD

Embodiments described herein relate to electronic circuits and design automation (EDA), and to associated systems, methods, devices, and instructions for generation of circuit design files. Some embodiments pertain to microprocessor interface circuits with memory devices (e.g., double data rate (DDR) synchronous dynamic random access memory (SDRAM) such as DDR2, DDR3, DDR4 and low power double data rate (LPDDR) SDRAM used in portable electronic devices). Some embodiments particularly relate to memory interface receivers.

BACKGROUND

A typical computing machine is implemented with a microprocessor, memory, and a number of other modules depending on the function to be performed by the computing machine. DDR random access memory (RAM) is a particular type of RAM commonly used in current technology that performs two read accesses or two write accesses per clock cycle. Both microprocessors and DDR RAM operate on various different power supply voltages. Interface circuits that can convert between different signal levels and different drive levels are used to allow for compatible communications between microprocessors and memory devices.

EDA is a category of systems for assisting with the design of electronic systems and devices. Large, integrated circuit designs are often assembled from previously designed blocks. This enables reduced turnaround times for generation of an integrated circuit. Schematic and layout information for such block portions of a design may be exchanged or licensed as intellectual property.

DETAILED DESCRIPTION

Embodiments described herein relate to microprocessor interface circuits with memory devices, particularly memory devices such as DDR SDRAM such as DDR2, DDR3, DDR4, and low power double data rate (LPDDR) SDRAM used in portable electronic devices. Some embodiments particularly relate to driving these memory devices from microprocessors with a low core voltage. The following description and the drawings illustrate specific embodiments to enable those skilled in the art to practice them. Other embodiments can incorporate structural, logical, electrical, process, and other changes. Portions and features of some embodiments can be included in, or substituted for, those of other embodiments, and are intended to cover all available equivalents of the elements described.

Some embodiments described herein relate to circuits designed in complementary metal oxide semiconductor field effect transistors (CMOS). These transistors are used in some digital integrated circuits for their simplicity, low cost, high density, and low power dissipation. Specifically, CMOS transistors only dissipate power while dynamically switching and exhibit no static power dissipation. The CMOS transistors are either of an N-type or a P-type, which refers to the doping content of the channel of the transistor. For example, an N-channel CMOS transistor produces an N-channel when the gate voltage exceeds a threshold. The N-type or N-channel transistors will be referred to as N-channel metal oxide semiconductor (NMOS) field effect transistors (FET) and the P-type or P-channel transistors will be referred to as P-channel metal oxide semiconductor (PMOS) FETs. Common voltages used to describe these transistors are the gate to source voltage ($V_{gs}$), drain to source voltage ($V_{ds}$) and threshold voltage ($V_t$). The current through the transistors is the drain to source current ($I_{ds}$). For NMOS transistors, all these values, in some embodiments, are positive and for PMOS transistors, in some embodiments, all these values are negative. In various embodiments described herein, the PMOS voltages and current will be described in terms of absolute values. Specifically, when referring to PMOS transistors, the gate to source voltage will mean $|V_{gs}|$, the drain to source voltage will mean $|V_{ds}|$, the threshold voltage will mean $|V_t|$, and the drain current will mean $|I_{ds}|$. Anywhere herein where particular values are used, including specific values (e.g. 0 volts, 0.7 volts, etc.), it is to be understood that this is referring to a target value that operates within a variation tolerance around or approximate to the described value, where the variation is within tolerances set by the specific implementation (e.g. +/−0.05 volts, etc.)

Figure 1:
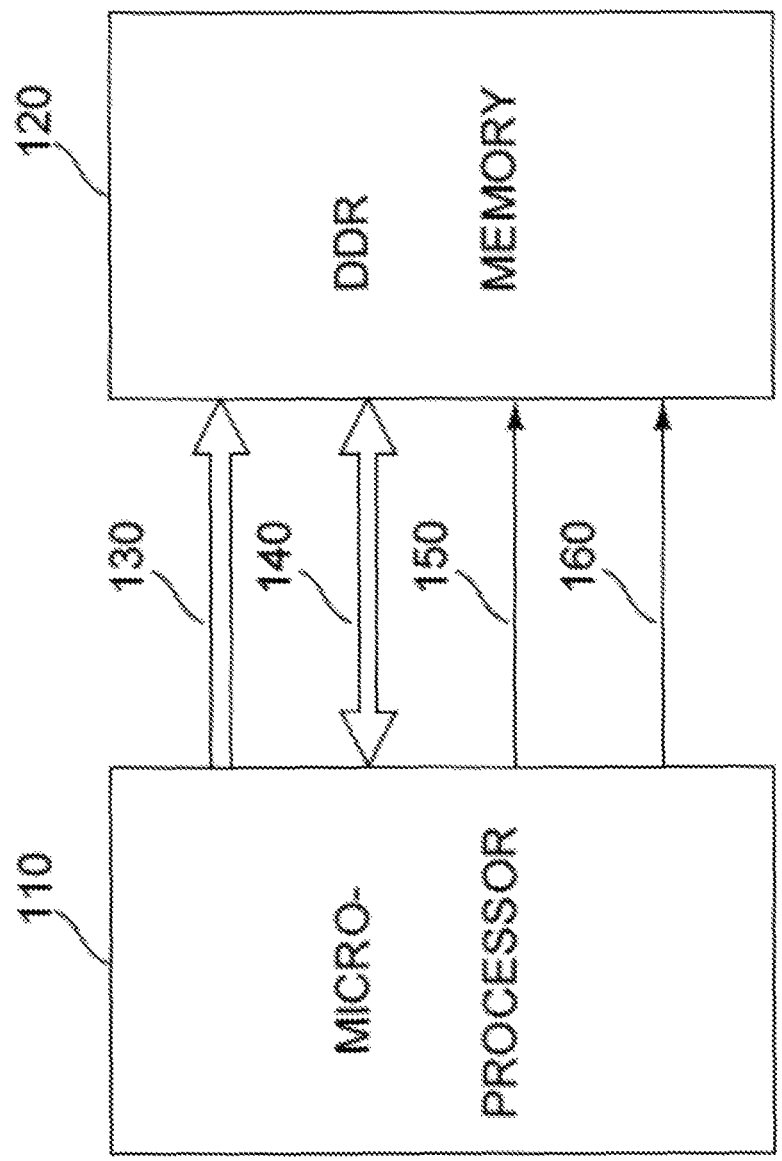
FIG. 1 illustrates the interface between a microprocessor and a memory module, in accordance with some embodiments described herein.

FIG. 1 illustrates the interface between microprocessor 110 and a memory module 120, in accordance with some embodiments described herein. The memory module 120 is a dynamic random access memory (DRAM) that is connected to the microprocessor 110 by an address bus 130, a data bus 140, and the control signals read-write (R/W) 150, and chip-enable (CE) 160. The system shown in FIG. 1. is a generic simple implementation of a microprocessor system that would be modified in various ways depending on the application. The memory module 120 is a DDR SDRAM.

Non-volatile memory is memory that retains the stored information even when powered off. Examples of non-volatile memory are hard disks, memory tapes, and flash RAM. Volatile RAM is memory that loses the information when power is disconnected. Examples of volatile ram are static RAM (SRAM) and dynamic RAM (DRAM). SRAM uses more transistors in a feedback latch up configuration, which does not include refreshing operations. DRAM may be implemented with a small capacitor which will slowly leak charge and consequently needs to be periodically refreshed. SRAM is faster and more expensive and used sparingly in devices such as a high speed cache. DRAM is one method for the bulk volatile memory access. DRAM may be controlled on a system clock and therefore referred to as SDRAM.

SDR SDRAM was originally built to execute one memory read access or one write access per clock cycle. On each clock cycle, a n-bit word may be transferred to or from the memory. The word length is, in some embodiments, configured in multiples of eight, and in more recent computer machines, it is common to transfer 64 bit words per clock cycle. DDR SDRAM was implemented as an improvement over SDR SDRAM and is capable of performing two read accesses or two write accesses per clock cycle. This was accomplished by performing one access on the rising edge of the clock and one access on the falling edge of the clock. In this manner, the data transfer rate is doubled by transferring two 64 bit words per clock cycle.

The operation of the microprocessor 110 involves the execution of programs that are loaded into the memory module 120 so as to create, edit, and delete data that is also stored in the memory module 120 or other devices. Specifically, each microprocessor operation involves a fetch and execute cycle where an instruction is read from the memory module 120, decoded by the microprocessor 110, and executed. Also, the execution of the instruction often involves a data read or a data write to the memory module 120. Each of these instruction cycles is performed synchronously to a system clock, with the duration of the instruction cycle lasting between one and three clock cycles.

The memory access interface traditionally involves bi-directional data bus 140 with a bus width of n-bits to provide the transfer to and from the memory module 120 in the form of n-bit words. The location in the memory module 120 which the data word is being written to or read from is indicated by the address bus 130. The memory module 120 is selected by the CE signal, which allows the data bus 140 to be used by other devices not shown in FIG. 1. The R/W 150 signal indicates to the memory module 120 whether the data access is a read operation or a write operation. This also determines the directional operation of the data bus 140. A clock signal is used to synchronize the microprocessor 110 and the memory module 120 during memory access and is not shown in FIG. 1.

During a write operation, the microprocessor 110 indicates the address location on the address bus 130 and places the data on the data bus 140. It also asserts the CE signal 160 and the R/W signal 150 for a write operation. Then the DDR SDRAM 120 writes the data on the data bus 140 into the memory at the address location indicated by the address bus 130, and the write operation is complete. During a read operation, the microprocessor 110 indicates the address location on the address bus 130 and floats the data bus 140 (high Z or high impedance state). It also asserts the CE signal 160 and the R/W signal 150 for a read operation. Then the DDR SDRAM 120 places the data at the memory location indicated by the address bus 130 onto the data bus 140. The microprocessor 110 then reads the data from the data bus 140, and the read operation is complete. All these functions are synchronized to the system clock, which is provided to both the microprocessor 110 and the memory module 120. This a description of a microprocessor 110 with a very simple implementation. Many implementations are significantly more complicated involving memory caches, direct memory access transfers, and a plethora of other devices connected to the microprocessor system bus.

The frequency with which the microprocessors 110 access memory 120 impacts performance. Since every instruction cycle involves at least one memory access, the speed of a computer machine is greatly limited by the memory access speed. Therefore, improving the method and speed of the memory access plays a continuing role in the evolution of computer machines. There are several related factors. The interface circuits that are controlling the bus are configured to have sufficient drive capability to quickly switch under the loading conditions as presented by the bus lines and the chips connected to them. The signals propagate fast enough along the bus lines that transmission effects become significant. Therefore, the bus lines, along with the source and load impedances, are controlled so as to reduce reflections. Additionally, the memory module 120 and the microprocessor 110 may operate at different power supply voltages. Therefore, memory access may involve the use of a level translator.

Memory types such as DDR3, DDR4, LPDDR3, and LPDDR4 typically operate between a $V_{ddq}$=1.6 Volt supply voltage down to a $V_{ddq}$=1.0 Volt supply voltage, while current microprocessor cores operate with a power supply voltage as low as low as $V_{dd}$=0.65 Volts. Therefore, translator interface circuits are needed that can drive a memory module 120 operating on a higher supply voltage from a microprocessor 110 with a lower core voltage. The microprocessor supply voltage, core supply voltage, or signal supply voltage will be referred to as $V_{dd}$ while the memory supply voltage or I/O supply voltage will be referred to as $V_{ddq}$.

Integrated circuit (IC) technologies offer different types of transistor devices depending on their intended application. Specifically, there are signal devices and (I/O devices. The microprocessor 110 uses signal devices operating on the lower microprocessor core supply voltage for computation and program execution. The microprocessor uses I/O devices that can withstand larger voltage levels and higher power levels to interface with external circuits and chips. The signal devices, such as a signal metal oxide semiconductor field effect transistors (MOSFETs), are built for low power consumption and switching speed. A MOSFET transistor is typically built with a metal or polysilicon gate material constructed over the channel of the transistor. When the voltage applied to the gate terminal exceeds a certain threshold (threshold voltage$V_t$), a conductive channel forms beneath the gate allowing current to flow from the source to the drain. A thin oxide layer separates and insulates the gate from the channel. The oxide layer is deliberately designed to be very thin to improve transistor characteristics such as the unity gain frequency and threshold voltage. If the gate to drain or gate to source voltage across the oxide layer exceeds a certain level, the transistor will be damaged. The larger I/O transistors are built with a greater power handling capability and with a thicker oxide layer. This allows the I/O transistor to operate with I/O voltage levels without causing damage to the transistor. In some embodiments, such signal transistors consume less power, occupy less chip area, and switch faster.

Figure 2:
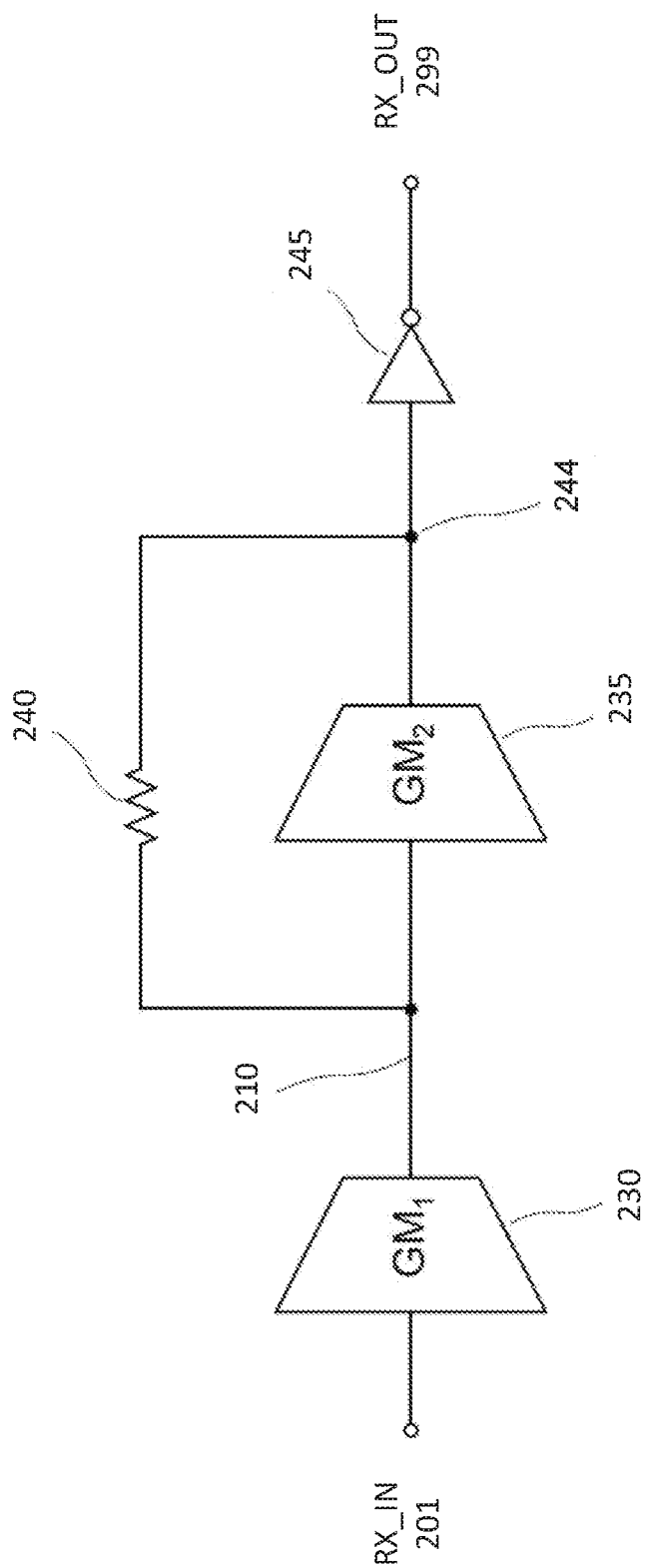
FIG. 2 illustrates a receiver interface implemented with a trans-conductance amplifier and a trans-impedance amplifier, in accordance with some embodiments.

FIG. 2 illustrates a receiver interface implemented with a trans-conductance amplifier 230 and a trans-impedance amplifier, in accordance with some embodiments. The received input signal (RX_IN) 201 is converted to an output current by the trans-conductance amplifier 230. The trans-impedance amplifier, comprising the trans-conductor 235 and the resistor 240, converts the output current back into an output voltage that is compatible with the microprocessor core voltage levels. The output of the trans-impedance amplifier is conditioned (a "squaring up" process) by inverter 245 takes the signal from node 244 to provide the received signal output (RX_OUT) 299. In some embodiments, the trans-conductance amplifier is implemented with passive components that are insensitive to the larger voltage levels from which the DDR memory may operate, and since the output of the trans-conductance amplifier is a current that is proportional to the voltage input, the output current carries the data information. Therefore, the output voltage at node 210 of the trans-conductance amplifier 230 can be held relatively constant (and below the core supply voltage) so as to avoid damaging any signal devices. The trans-impedance amplifier uses negative feedback via resistor 240 from the trans-conductor 235 (e.g. where $GM_2$ is negative).

Figure 3:
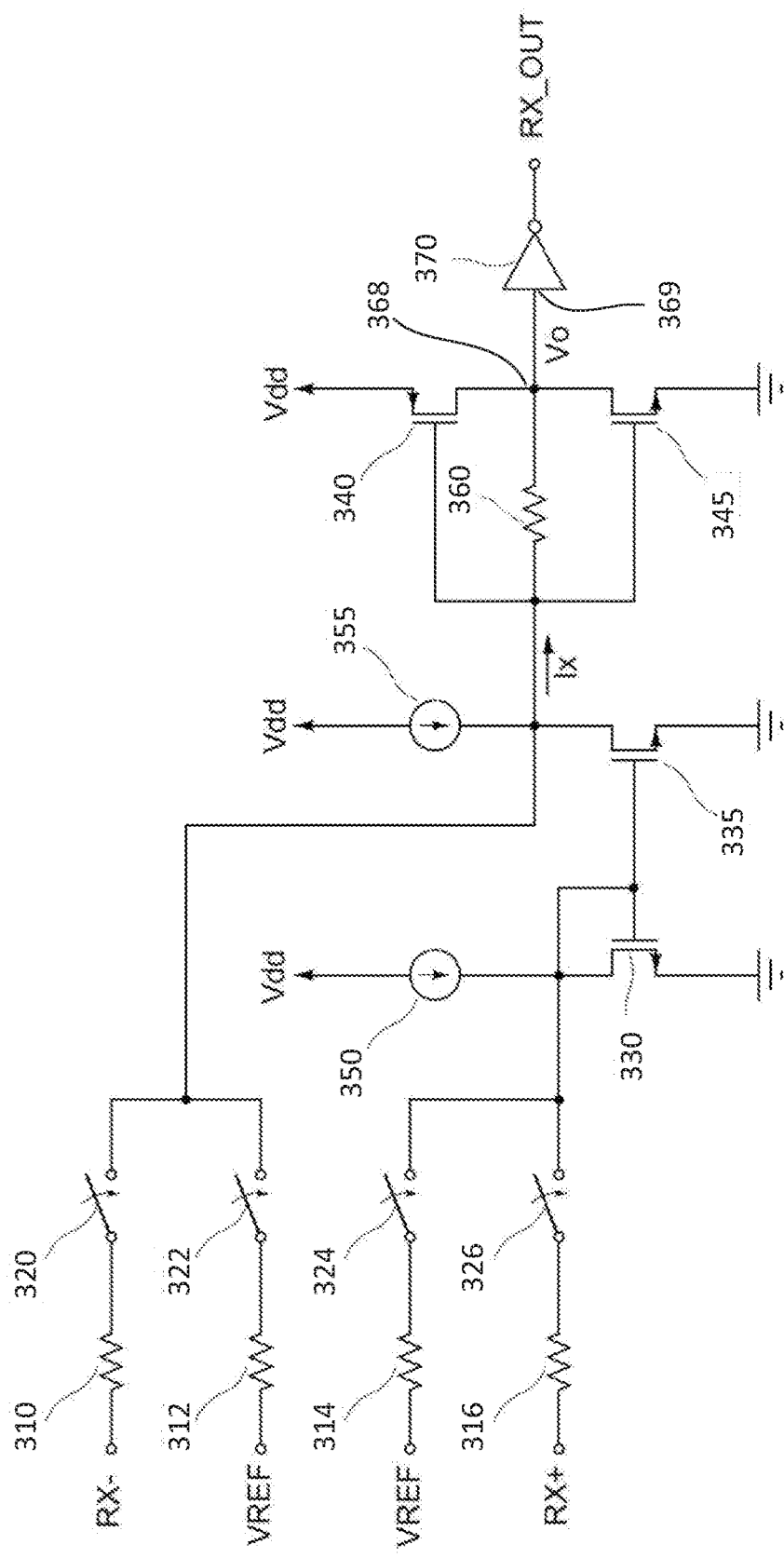
FIG. 3 illustrates an example circuit implementation of a receiver, in accordance with some embodiments.

FIG. 3 illustrates an example circuit implementation of a receiver, in accordance with some embodiments. The receiver of FIG. 3 may be an example of the trans-conductance amplifier followed by the trans-impedance amplifier as described in FIG. 2, in accordance with some embodiments. The trans-conductance amplifier of FIG. 3 is implemented with resistors 310, 312, 314 and 316, switches 320, 322, 324, and 326, current sources 350 and 355, and with NMOS FETs 330 and 335. The trans-impedance amplifier is implemented with the NMOS FET 345, the PMOS FET 340 and the resistor 360. In other embodiments, other implementations of such amplifiers are used.

The circuit can receive a single ended or differential input from a DDR memory device using the RX+ and RX− input terminals. The VREF input terminals provide a common mode voltage level from the DDR receiver. Each of the inputs can be connected or disconnected through a switch depending on the mode the circuit is operating in. In one example embodiment, the operating modes are:

Singe ended data receiving—Switches 322 and 326 are closed while switches 320 and 224 are open.
Differential data receiving—Switches 320 and 326 are closed while switches 322 and 324 are open.
Calibration mode where switches 322 and 324 are closed and switches 320 and 326 are open.

Resistors 310, 312, 314, and 316 are all of the same value and capable of withstanding the voltage drive levels from the DDR memory chip. Switches 320, 322, 324, and 326 are implemented with I/O devices such as transmission gates built with an I/O PMOS FET and an I/O NMOS FET. The current sources 350 and 355 are set during a calibration phase described below. The NMOS FET 330 is diode connected to copy its drain current to NMOS FET 335. The variation in drain current of NMOS FET 335 is sensed by the trans-impedance amplifier through resistor 360 and converted to an output voltage. The output voltage from terminal 368 is conditioned through inverter 370 via input terminal 369 to provide received data output at core supply levels.

During a single ended data receiving operation, the DDR memory signal is received on RX+ with switch 326 closed. When RX+ switches high or low, the current through resistor 316 is increased or decreased. This current is shunted to ground through the diode connected NMOS FET 330 along with the current from the current source 350. The variation in current produces a one to one variation in the gate to source voltage of NMOS FET 330. The gate to source voltage of NMOS FET 335 is identical to that of NMOS FET 330. Thus, neglecting the difference in drain to source voltage, NMOS FET 330 and NMOS FET 335 will have the same drain current. Therefore, the drain current of NMOS FET 335 will reflect any voltage variation from the RX+ input signal. The current drive into the trans-impedance amplifier, Ix, is equal to the current being sourced by VREF through resistor 312 along with the current source 355 minus the drain to source current sinking through NMOS FET 335.

$$I_x = I_{vref} + I_{source} - I_{ds} \quad (1)$$

To the extent that the drain voltage of NMOS FET 335 is held constant, $I_{vref}$ and $I_{source}$ are constant. Therefore, in some embodiments, the variation in $I_{ds}$ is transferred to the trans-impedance amplifier in $I_x$.

The trans-impedance amplifier converts the current Ix into a proportional output voltage. It is formed with a trans-conductor made up of PMOS FET 340 and NMOS FET 345 and the feedback resistor 360. Initially, consider the case where $I_x=0$. Then the voltage drop across resistor 360 is zero and $V_{fb}=V_O$ and, NMOS FET 345 and PMOS FET 340 will have the same drain current. The transistor dimensions and carrier mobility can be controlled so as to bias the output voltage $V_O$ at an equilibrium point approximately half way between $V_{dd}$ and ground such that the sum of their gate to source voltages is equal to $V_{dd}$. This is a stable negative feedback configuration. For instance, suppose some noise pushes the gate voltage ($V_{fb}$) slightly more positive. Then, the PMOS FET 340 will source less current and NMOS FET 345 will sink more current. This in turn will pull $V_O$ down, pulling $V_{fb}$ and opposing the initial increase in $V_{fb}$ (negative feedback). Thus, the trans-impedance amplifier works to maintain the quiescent feedback voltage ($V_{fb}$). Since in some embodiments the core supply voltage $V_{dd}$ can be as low as 0.65 Volts, the NMOS FET 345 and PMOS FET 340 are implemented with low threshold devices. This way, both transistors will be on even when their gate to source voltages are only 0.35 Volts. While specific example voltages are discussed herein, other voltages are used in other embodiments, and any discussed voltages are within an associated operational tolerance based on the specific implementation.

The quiescent operating point of the trans-impedance amplifier is determined during calibration with current sources 350 and 355. The current sources 350 and 355 are configured such that with both VREF inputs engaged, the input trans-impedance current $I_x$ produces an output voltage $V_O$ right at the input switching threshold of the CMOS inverter 370. Since VREF is half way between the high input signal and the low input, this sets the decision threshold at the input of the receiver to match the switching threshold of the CMOS inverter 370. This calibration procedure is what determines the quiescent operating point for $I_x$ and $V_{fb}$.

A small signal analysis can further describe the voltage and current variation of the trans-impedance amplifier. Define $i_x$, $v_O$, and $V_{fb}$ as small signals varying around the quiescent operating point. Since both transistors have the same gate voltage, the total trans-conductance of the inverter pair is:

$$G_m = gm_p + gm_N \quad (2)$$

where $gm_p$ and $gm_p$ are the trans-conductances PMOS FET 340 and NMOS FET 345. Note this is the trans-conductance where the output current of the trans-conductance amplifier is referenced sinking current (into the trans-conductor). Then $$i_x = G_m v_{fb} \quad (3)$$

and $$v_O = v_{fb} - i_x R_x = i_x \left( \frac{1}{G_m - R_x} \right)$$

Here, $G_m R_x > 1$ and so the trans-impedance gain is negative. Also, for reasonably large $G_m$, the feedback voltage $V_{fb}$ variation will be small and the quiescent feedback voltage, $V_{fb}$ will be maintained by the negative feedback. Specifically, if $I_x$ increases, the gate voltages (and $V_{fb}$) of NMOS FET 345 and PMOS FET 340 will initially increase. This causes the PMOS FET 340 to source less current and the NMOS FET 345 to sink more current and the output voltage, $V_o$, will drop. This will draw current through resistor 360, and pull the gate voltages of NMOS FET 345 and PMOS FET 340 down, counteracting the initial increase (negative feedback). Similar remarks apply for the opposite condition; If $I_x$ decreases, the negative feedback will cause the output voltage $V_o$ to increase. The negative feedback trans-impedance amplifier has only two poles and is inherently stable.

The resistors 310, 312, 314, and 316 along with switches 320, 322, 324 and 326 may be exposed to I/O voltage levels and are implemented with I/O devices. However, the resistors and switches shield the remaining devices in the circuit. None of the transistors 330, 335, 340, and 345 are exposed to I/O voltages and can be implemented with signal devices. Current sources 350 and 355 along with the inverter 370 are also implemented with signal devices. This results in a large performance improvement along with a reduction in power consumption and chip area.

Differential operation is set with switches 320 and 326 closed. The circuit operation for the positive receive input terminal (RX+) is identical to that described above. The current injected through the positive terminal, RX+, sinks through the diode connected NMOS FET 330 and is copied by NMOS FET 335. This current sinks through NMOS FET 335 with a direction of opposite sense to $I_x$ as referenced in FIG. 3. In this way, if the voltage at RX+ increases, $I_x$ decreases. The current injected through the negative terminal RX− adds with the current $I_x$. In this way, if the voltage at RX− increases, $I_x$ increases. Since the positive receive input terminal RX+ and the negative receive input RX− move in opposite directions during differential operation, their cumulative effect will re-enforce each other on the signal current $I_x$.

The current sources are set during a calibration procedure with common mode voltages, VREF. The calibration procedure is performed with switches 322 and 324 closed. VREF is the voltage half way between the high input signal level and the low input signal level. Therefore, the decision threshold of the DDR memory receiver is set at the input level of VREF. Two calibration procedures are undertaken to allow the DDR memory receiver to operate with different DDR devices operating with different signal levels. First, the current source 350 is set by copying a replica current mirror sinking a preset desired current. The purpose of the current source 350 is to ensure that NMOS FET 330 stays on even when the positive receive input terminal is low to provide full signal swing. Further, the time constant at the gate node of NMOS FET 330 is partially determined by the reciprocal of the trans-conductance of NMOS FET 330. Increasing the current source 350 will increase the trans-conductance of NMOS FET 335 and improve the bandwidth of the current mirror. Of course, the drawback to increasing the current source 350 is that it will consume more power. Having chosen the preset current through a replica diode connected NMOS FET, the current source 350 is increased (with the common mode current being sourced from VREF) until the gate to source voltage of NMOS FET 330 matches the replica diode connected NMOS FET.

The current source 355 is used to set the threshold level of the receiver with a second calibration procedure. As with the first calibration procedure, both switches 322 and 324 are closed. Initially, with a very small current being sourced from 355, $I_x$ will be low, the output of the trans-impedance amplifier will be high, and the output of the inverter 370 will be low. Then, while monitoring the receiver output RX_OUT, the current source 355 is incrementally increased. This will increase $I_x$ and gradually push the output of the trans-impedance amplifier low. When the output of the trans-impedance amplifier reaches the switching threshold of the CMOS inverter 370, RX_OUT will switch high. When RX_OUT switches high, the current source 355 is fixed with that particular current setting. Since the inverter 370 output switches at that current setting with the inputs set to the common mode, the DDR memory receiver decision threshold will be set half way between the high receive input signal level and the low receive input signal level at VREF.

The calibration procedure described above can be used to set the current through NMOS FET 330 for full signal swing (such that NMOS FET 330 stays on while the input is switching) and a centerline threshold level for any type of DDR memory chip that it is receiving from. For example, in one embodiment, the DDR memory is operating on an approximately 1.5 Volt supply and the input received signal varies from approximately 0.5 Volts to 1.5 Volts. In one such embodiment, a common mode VREF would be 1 Volt, and this is set as the memory receiver decision threshold with the calibration procedure described above.

In various systems, receiver functions have been implemented using a MOS differential pair input. For single ended operation, one side of the differential pair is set to VREF. Due to the wide variation of input signal levels, both an NMOS and a PMOS differential pair are implemented. Depending on the common mode level, either the NMOS differential pair or the PMOS differential pair is actively used for receiving. The output of the differential pair is connected to a folded cascode for level translation and loading. This is then connected to a common mode logic (CML) stage and then through a CML-to-CMOS converter. Both the differential input stages are implemented using I/O devices to withstand the large voltage levels seen at the I/O terminals. This increases power consumption and chip area and reduces performance. Also, during large signal swings, the differential pairs are sometimes driven into a non-linear operating range causing duty cycle distortion.

In some embodiments described herein, the differential amplifier stages and the folded cascade circuits are not used. The CML stage and CML-to-CMOS converter are also eliminated. By eliminating all these circuit blocks, there are large gains in terms of chip area and power consumption. Also, most of the transistors in the proposed embodiments are signal transistors, which improves the performance in terms of switching speed and bandwidth. This reduces the inter-symbol interference, allows for receiving at higher data rates, and reduces the need for equalization techniques.

Figure 4:
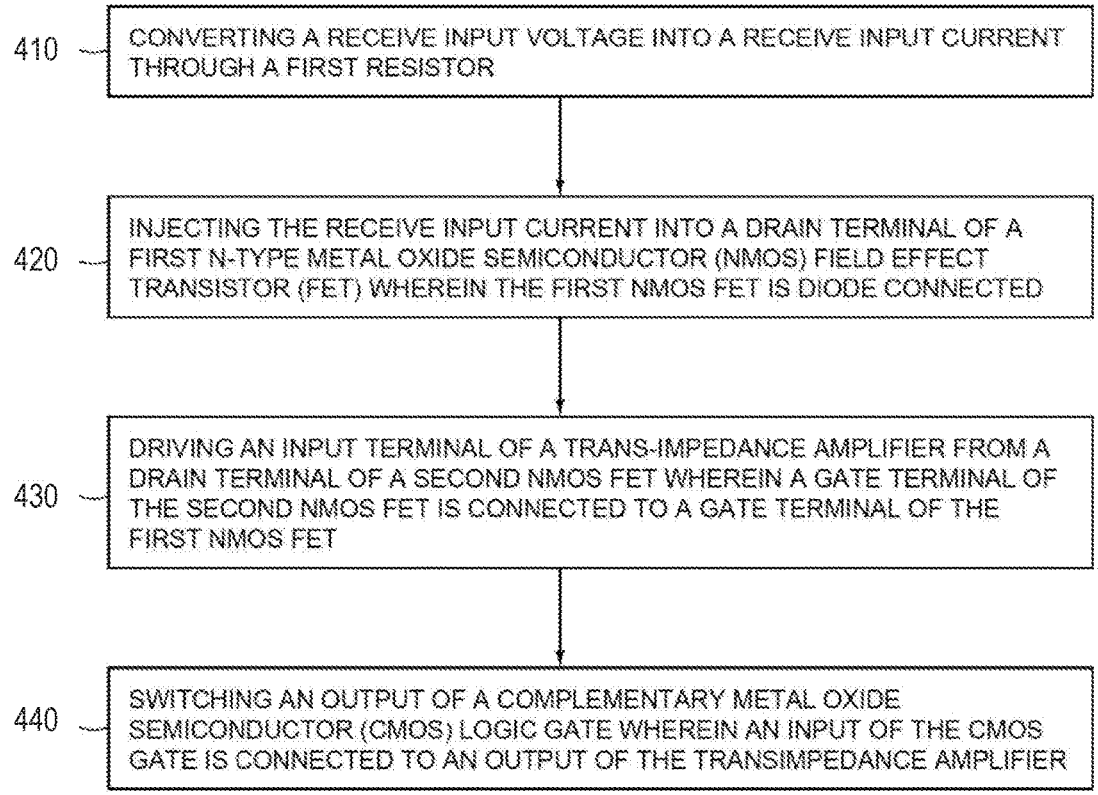
FIG. 4 illustrates an example operational flow of a receiver apparatus, in accordance with some embodiments.

FIG. 4 illustrates an example operational flow of a receiver apparatus, in accordance with some embodiments. FIG. 4 shows method 400, which may be performed by a device, in accordance with some embodiments. In other embodiments, method 400 is simulated by a circuit design within an EDA computing system as part of design verification or other circuit design operations. In such embodiments, circuit design files or other EDA files may comprise instructions that, when executed by one or more processors, cause the EDA device to perform or simulate method 400.

The example embodiment of method 400 begins with operation 410 converting a receive input voltage into a receive input current through a first resistor. Operation 420 then involves injecting the receive input current into a drain terminal of a first NMOS FET wherein the first NMOS FET is diode connected. An input terminal of a trans-impedance amplifier is driven from a drain terminal of a second NMOS FET in operation 430, wherein a gate terminal of the second NMOS FET is connected to a gate terminal of the first NMOS FET. An output of a CMOS logic gate is switched in operation 440, wherein an input of the CMOS logic gate is connected to an output of the trans-impedance amplifier.

In various embodiments, additional operations may be performed as part of further embodiments. For example, some embodiments additionally involve shielding the first NMOS FET and the second NMOS FET from I/O voltage levels using the resistor wherein the first NMOS FET and the second NMOS FET are low voltage devices. Some embodiments involve sourcing a first bias current into the drain terminal of the first NMOS FET such that the first NMOS FET remains active when the receive input voltage is low. Some such embodiments further involve sourcing a second bias current into the drain terminal of the second NMOS FET such that the output of the CMOS logic gate switches when the receive input voltage transitions through a decision threshold voltage. Other further embodiments involve disconnecting the receive input voltage by opening a first switch connected between the first resistor and the drain terminal of the first NMOS FET; injecting a reference current into the first NMOS FET by closing a second switch connected between a reference input voltage and the drain terminal of the first NMOS FET; and calibrating the second bias current by incrementally increasing until the output of the CMOS logic gate switches; wherein the reference input voltage is a common mode voltage of the receive input voltage.

These operations may be performed by various devices described herein, as well as any other suitable structured device. In some embodiments, the above methods are simulated by EDA systems operating on an EDA computing device to model and test a circuit design.

One such example apparatus comprises a first resistor wherein a first terminal of the first resistor is connected to a first receiver input of the memory receiver apparatus; a first NMOS FET wherein a drain terminal of the first NMOS FET is connected to a second terminal of the first resistor and a gate terminal of the first NMOS FET is connected to the drain terminal of the first NMOS FET; a second NMOS FET wherein a gate terminal of the second NMOS FET is connected to the gate terminal of the first NMOS FET; a trans-impedance amplifier wherein an input terminal of the trans-impedance amplifier is connected to a drain terminal of the second NMOS FET; and a CMOS logic gate wherein an input terminal of the CMOS logic gate is connected to a data output terminal of the receiver apparatus.

In some embodiments, such an apparatus is structured where the first NMOS FET and the second NMOS FET are low voltage devices and wherein the first resistor is configured to shield the first NMOS FET and the second NMOS FET from I/O voltage levels. Further embodiments may include a first current source connected to the drain terminal of the first NMOS FET and a second current source connected to the drain terminal of the second NMOS FET. Some additional embodiments are structured where the first current source is configured to maintain the first NMOS transistor in active mode when the first receiver input is low. Still further such embodiments are structured where the second current source is configured to set a decision threshold voltage of the first receiver input and wherein the data output terminal is configured to switch when a voltage at the first receiver input exceeds the decision threshold.

Additionally, some embodiments include a first switch connected between the second terminal of the first resistor and the drain terminal of the first NMOS FET; a second resistor wherein a first terminal of the second resistor is connected to a voltage reference (VREF) terminal that is configured to indicate a common mode of the first receiver input; and a second switch wherein a first terminal of the second switch is connected to a second terminal of the second resistor and a second terminal of the second switch is connected to the drain terminal of the first NMOS FET. Some such embodiments also include control circuitry configured to calibrate a decision threshold of the first receiver input to be the common mode. Other such embodiments have the first switch and the second switch implemented with CMOS transmission gates comprising I/O FETs.

Still further such embodiments include a third resistor wherein a first terminal of the third resistor is connected to a VREF terminal that is configured to indicate a common mode of the first receiver input; a third switch wherein a first terminal of the third switch is connected to a second terminal of the third resistor and a second terminal of the third switch is connected to the drain terminal of the second NMOS FET; a fourth resistor wherein a first terminal of the fourth resistor is connected to a second receiver input of the receiver apparatus; and a fourth switch wherein a first terminal of the fourth switch is connected to a second terminal of the third resistor and a second terminal of the third switch is connected to the drain terminal of the second NMOS FET. In some such embodiments, the first receiver input and the second receiver input are configured to receive a differential signal.

Some embodiments also are structured where the trans-impedance amplifier comprises: a PMOS FET configured to source current to the output terminal of the trans-impedance amplifier wherein a gate terminal of the PMOS FET is connected to the input terminal of the trans-impedance amplifier; a third NMOS FET configured to sink current from the output terminal of the trans-impedance amplifier wherein a gate terminal of the NMOS FET is connected to the input terminal of the trans-impedance amplifier; and a resistor connected in a feedback configuration between the input terminal of the trans-impedance amplifier and the output terminal of the trans-impedance amplifier. Some such embodiments are further structured where the trans-impedance amplifier is configured to operate from a core supply voltage that is less than an I/O supply voltage.

In various embodiments, aspects of the circuitry are implemented differently, including structures with a digital signal processor, a programmable logic device, a field programmable gate array, a microprocessor, a microcontroller, or a digital application specific integrated circuit (ASIC).

Any apparatus described herein may be modeled and simulated using EDA tools. Some embodiments, then, rather than being physical circuits, are non-transitory computer readable media comprising instructions that, when executed by one or more processors of a computing device, cause the computing device to generate a circuit design by configuring the computing device to perform operations comprising configuring circuit elements within a model circuit design file as part of a circuit design. Such circuit design files are further used to model operation in accordance with some embodiments.

Additionally, it will be apparent that any apparatus or operations described herein in accordance with various embodiments may be structured with intervening, repeated, or other elements while still remaining within the scope of the contemplated embodiments. Some embodiments may include multiple receivers, along with any other circuit elements. Some embodiments may function with described operating modes as well as other operating modes. The various embodiments described herein are thus presented as examples, and do not exhaustively describe every possible implementation in accordance with the possible embodiments.

Figure 5:
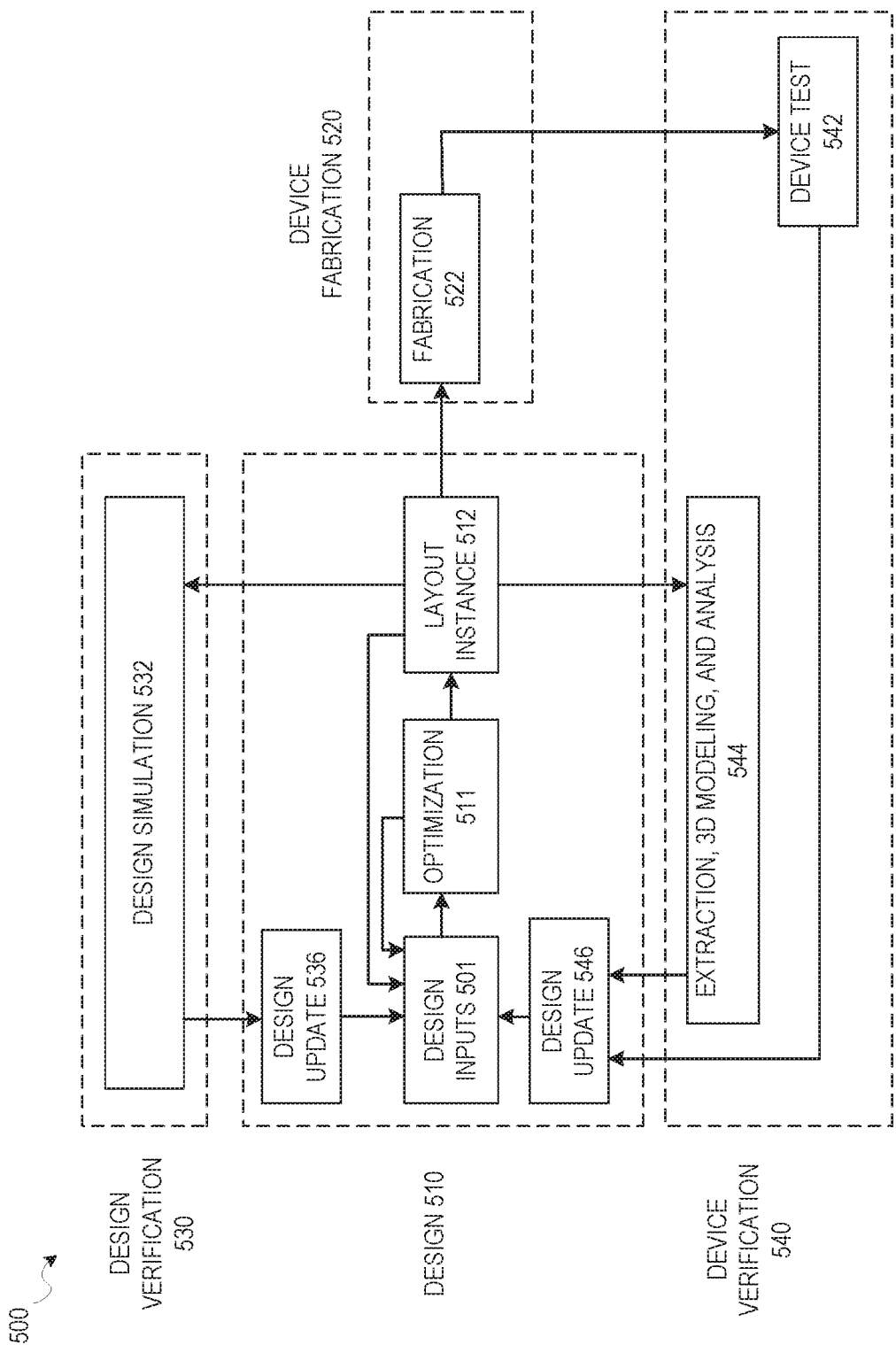
FIG. 5 is a diagram illustrating one possible design process flow for generating a circuit including embodiments to implement receiver circuits to interface a microprocessor with memory, in accordance with some embodiments.

FIG. 5 is a diagram illustrating one possible design process flow for generating a circuit including embodiments to implement receiver circuits to interface a microprocessor 50 with memory, in accordance with some embodiments. As illustrated, the overall design flow 500 includes a design phase 510, a device fabrication phase 520, a design verification phase 530, and a device verification phase 540. The design phase 510 involves an initial design input operation 501 where the basic elements and functionality of a device are determined, as well as revisions based on various analyses and optimization of a circuit design. This design input operation 501 is where instances of a design block are used in the design and any additional circuitry is selected. The initial strategy, tactics, and context for the device to be created are also generated in the design input operation 501, depending on the particular design algorithm to be used.

In some embodiments, following an initial selection of design values in design input operation 501, timing analysis and optimization, according to various embodiments, occurs in an optimization operation 511, along with any other automated design processes. One such process may be the automated design of control circuitry to switch a DDR programmable level translator device depending on the type of DDR memory being accessed. As described below, design constraints for blocks of a circuit design generated with design inputs in design input operation 501 may be analyzed using hierarchical timing analysis according to various embodiments. While design flow 500 shows such optimization occurring prior to layout instance 512, such hierarchical timing analysis and optimization may be performed at any time to verify operation of a circuit design. For example, in various embodiments, constraints for blocks in a circuit design may be generated prior to routing of connections in a circuit design, after routing, during register transfer level (RTL) operations, or as part of a final signoff optimization or verification prior to a device fabrication operation 522.

After design inputs are used in design input operation 501 to generate a circuit layout, and any optimization operations 511 are performed, a layout is generated in layout instance 512. The layout describes the physical layout dimensions of the device that match the design inputs. This layout may then be used in a fabrication operation 522 to generate a device, or additional testing and design updates may be performed using designer inputs or automated updates based on the design simulation 532 operations or three dimensional structure modeling and analysis 544 operations. Once the device is generated, the device can be tested as part of device test 542 operations, and layout modifications generated based on actual device performance.

As described in more detail below, design updates 536 from design simulation 532, design updates 546 from device test 542 or 3D modeling and analysis 544 operations, or direct design input operation 501 may occur after an initial layout instance 512 is generated. In various embodiments, whenever design inputs are used to update or change an aspect of a circuit design, a timing analysis and optimization operation 511 may be performed.

For example, in various embodiments, a user may provide an input to an EDA computing device indicating placement of an instance of a design block within a first portion of a circuit design. Once a design is ready, another input to the EDA computing device may be used to generate constraints for each instance of the design block, and a timing analysis may be performed using the constraints. An output to a display of the EDA computing device may show results of the timing analysis, or may show optimizations recommended or automatically perform adjustments to the circuit design based on the timing analysis. Further inputs to the EDA computing device may involve adjustments as user design inputs, with additional timing analysis and optimization initiated via user operation of the EDA computing device.

Figure 6:
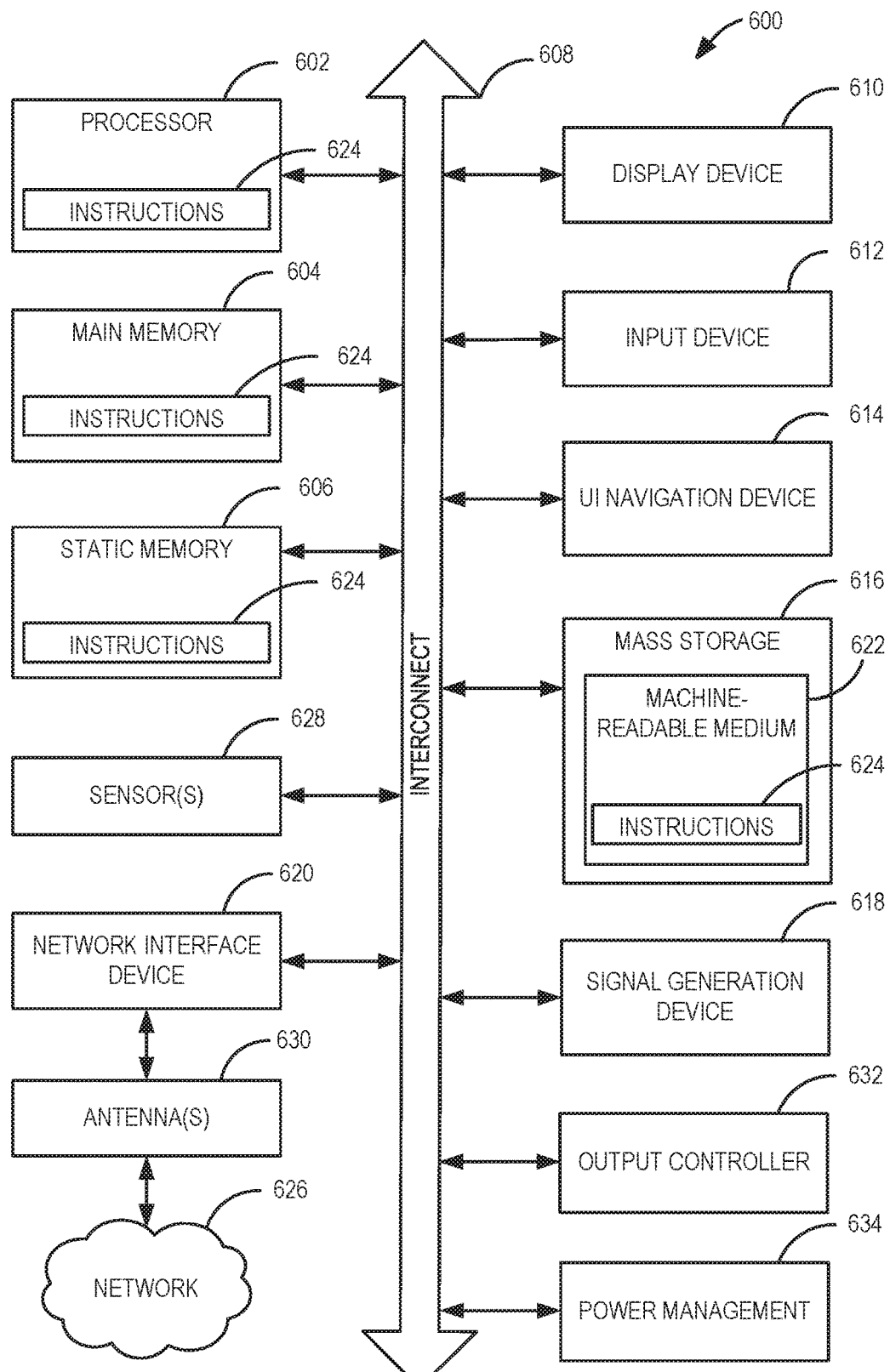
FIG. 6 is a block diagram illustrating an example computer system machine upon which any one or more of the methodologies herein discussed can be run.

FIG. 6 is a block diagram illustrating an example computer system machine 600 upon which any one or more of the methodologies herein discussed can be run. Computer system machine 600 or elements of computer system machine 600 may be used to implement any device, a mobile phone, tablet, laptop wireless access point, wireless station device, or any other such device described herein. In various other embodiments, different device components or multiples of any element may be used in different devices. Some embodiments may involve the use of a computer system machine 600 running electronic design automation tools to aid in the design and creation of hardware systems. In various alternative embodiments, the machine 600 operates as a standalone device or can be connected (e.g., networked) to other machines. In a networked deployment, the machine 600 can operate in the capacity of either a server or a client machine in server-client network environments, or it can act as a peer machine in peer-to-peer (or distributed) network environments. The machine 600 can be a personal computer (PC) that may or may not be portable (e.g., a notebook or a netbook), a tablet, a set-top box (STB), a gaming console, a personal digital assistant (PDA), a mobile telephone or smartphone, a web appliance, a network router, switch or bridge, or any machine capable of executing instructions (sequential or otherwise) that specify actions to be taken by that machine. Further, while only a single machine 600 is illustrated, the term "machine" shall also be taken to include any collection of machines that individually or jointly execute a set (or multiple sets) of instructions to perform any one or more of the methodologies discussed herein.

Example computer system machine 600 includes a processor 602 (e.g., a central processing unit (CPU), a graphics processing unit (GPU) or both), a main memory 604 and a static memory 606, which communicate with each other via an interconnect 608 (e.g., a link, a bus, etc.). The computer system machine 600 can further include a display device 610, an alphanumeric input device 612 (e.g., a keyboard), and a user interface (UI) navigation device 614 (e.g., a mouse). In one embodiment, the display device 610, input device 612, and UI navigation device 614 are a touch screen display. The computer system machine 600 can additionally include a storage device 616 (e.g., a drive unit), a signal generation device 618 (e.g., a speaker), an output controller 632, a power management controller 634, and a network interface device 620 (which can include or operably communicate with one or more antennas 630, transceivers, or other wireless communications hardware), and one or more sensors 628, such as a Global Positioning Sensor (GPS) sensor, compass, location sensor, accelerometer, or other sensor.

The storage device 616 includes a machine-readable medium 622 on which is stored one or more sets of data structures and instructions 624 (e.g., software) embodying or utilized by any one or more of the methodologies or functions described herein. The instructions 624 can also reside, completely or at least partially, within the main memory 604, static memory 606, and/or within the processor 602 during execution thereof by the computer system machine 600, with the main memory 604, static memory 606, and the processor 602 also constituting machine-readable media 622.

While the machine-readable medium 622 is illustrated in an example embodiment to be a single medium, the term "machine-readable medium" can include a single medium or multiple media (e.g., a centralized or distributed database, and/or associated caches and servers) that store the one or more instructions 624. The term "machine-readable medium" shall also be taken to include any tangible medium that is capable of storing, encoding or carrying instructions 624 for execution by the machine 600 and that cause the machine 600 to perform any one or more of the methodologies of the present disclosure or that is capable of storing, encoding or carrying data structures utilized by or associated with such instructions 624.

Various techniques, or certain aspects or portions thereof may take the form of program code (i.e., instructions 624) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor 602, a storage medium readable by the processor 602 (including volatile and non-volatile memory and/or storage elements), at least one input device 612, and at least one output device. The volatile and non-volatile memory and/or storage elements may be a RAM, erasable programmable read only memory (EPROM), flash drive, optical drive, magnetic hard drive, or other medium for storing electronic data. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

The embodiments described above can be implemented in one or a combination of hardware, firmware, and software. Various methods or techniques, or certain aspects or portions thereof, can take the form of program code (i.e., instructions 624) embodied in tangible media, such as flash memory, hard drives, portable storage devices, read-only memory (ROM), RAM, semiconductor memory devices (e.g., EPROM, electrically erasable programmable read-only memory (EEPROM)), magnetic disk storage media, optical storage media, and any other machine-readable storage medium 622 or storage device 616 wherein, when the program code is loaded into and executed by a machine 600, such as a computer or networking device, the machine 600 becomes an apparatus for practicing the various techniques.

A machine-readable storage medium 622 or other storage device 616 can include any non-transitory mechanism for storing information in a form readable by a machine 600 (e.g., a computer). In the case of program code executing on programmable computers, the computing device can include a processor 602, a storage medium readable by the processor 602 (including volatile and non-volatile memory and/or storage elements), at least one input device 612, and at least one output device. One or more programs that can implement or utilize the various techniques described herein can use an API, reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

It should be understood that the functional units or capabilities described in this specification can have been referred to or labeled as components or modules, in order to more particularly emphasize their implementation independence. For example, a component or module can be implemented as a hardware circuit comprising custom very-large-scale integration (VLSI) circuits or gate arrays, off-the-shelf semiconductors such as logic chips, transistors, or other discrete components. A component or module can also be implemented in programmable hardware devices such as field programmable gate arrays, programmable array logic, programmable logic devices, or the like. Components or modules can also be implemented in software for execution by various types of processors. An identified component or module of executable code can, for instance, comprise one or more physical or logical blocks of computer instructions 624, which can, for instance, be organized as an object, procedure, or function. Nevertheless, the executables of an identified component or module need not be physically located together, but can comprise disparate instructions 624 stored in different locations which, when joined logically together, comprise the component or module and achieve the stated purpose for the component or module.

Indeed, a component or module of executable code can be a single instruction, or many instructions 624, and can even be distributed over several different code segments, among different programs, and across several memory devices. Similarly, operational data can be identified and illustrated herein within components or modules, and can be embodied in any suitable form and organized within any suitable type of data structure. The operational data can be collected as a single data set, or can be distributed over different locations including over different storage devices 616, and can exist, at least partially, merely as electronic signals on a system or network. The components or modules can be passive or active, including agents operable to perform desired functions.

We claim that:

1. A receiver apparatus for receiving data from a memory device, the apparatus comprising:
a first resistor wherein a first terminal of the first resistor is connected to a first receiver input of the memory receiver apparatus;
a first N-type metal oxide semiconductor (NMOS) field effect transistor (FET) wherein a drain terminal of the first NMOS FET is connected to a second terminal of the first resistor and a gate terminal of the first NMOS FET is connected to the drain terminal of the first NMOS FET;
a second NMOS FET wherein a gate terminal of the second NMOS FET is connected to the gate terminal of the first NMOS FET;
a trans-impedance amplifier wherein an input terminal of the trans-impedance amplifier is connected to a drain terminal of the second NMOS FET; and
a complementary metal oxide semiconductor (CMOS) inverter wherein an input terminal of the CMOS inverter is connected to an output terminal of the trans-impedance amplifier;
wherein the first NMOS FET and the second NMOS FET are low voltage devices; and wherein the first resistor is configured to shield the first NMOS FET and the second NMOS FET from input/output (I/O) voltage levels.

2. The receiver apparatus of claim 1, further comprising:
a first current source connected to the drain terminal of the first NMOS FET; and
a second current source connected to the drain terminal of the second NMOS FET.

3. The receiver apparatus of claim 2, wherein the first current source is configured to maintain the first NMOS transistor in active mode when the first receiver input is low.

4. The receiver apparatus of claim 3, wherein the second current source is configured to set a decision threshold voltage of the first receiver input; and
wherein the data output terminal is configured to switch when a voltage at the first receiver input exceeds the decision threshold.

5. The receiver apparatus of claim 1, further comprising:
a first switch connected between the second terminal of the first resistor and the drain terminal of the first NMOS FET;
a second resistor wherein a first terminal of the second resistor is connected to a voltage reference (VREF) terminal that is configured to indicate a common mode of the first receiver input; and
a second switch wherein a first terminal of the second switch is connected to a second terminal of the second resistor and a second terminal of the second switch is connected to the drain terminal of the first NMOS FET.

6. The receiver apparatus of claim 5, further comprising control circuitry configured to calibrate a decision threshold of the first receiver input to be the common mode.

7. The receiver apparatus of claim 5, wherein the first switch and the second switch are implemented with CMOS transmission gates comprising I/O FETs.

8. The receiver apparatus of claim 5, further comprising:
a third resistor wherein a first terminal of the third resistor is connected to a voltage reference (VREF) terminal that is configured to indicate a common mode of the first receiver input;
a third switch wherein a first terminal of the third switch is connected to a second terminal of the third resistor and a second terminal of the third switch is connected to the drain terminal of the second NMOS FET;
a fourth resistor where in a first terminal of the fourth resistor is connected to a second receiver input of the receiver apparatus; and
a fourth switch wherein a first terminal of the fourth switch is connected to a second terminal of the third resistor and a second terminal of the third switch is connected to the drain terminal of the second NMOS FET, wherein the first receiver input and the second receiver input are configured to receive a differential signal.

9. The receiver apparatus of claim 1, wherein the trans-impedance amplifier comprises:
a P-channel metal oxide semiconductor (PMOS) FET configured to source current to the output terminal of the trans-impedance amplifier wherein a gate terminal of the PMOS FET is connected to the input terminal of the trans-impedance amplifier;
a third NMOS FET configured to sink current from the output terminal of the trans-impedance amplifier wherein a gate terminal of the NMOS FET is connected to the input terminal of the trans-impedance amplifier; and a resistor connected in a feedback configuration between the input terminal of the trans-impedance amplifier and the output terminal of the trans-impedance amplifier.

10. The receiver apparatus of claim 9, wherein the trans-impedance amplifier is configured to operate from a core supply voltage that is less than an I/O supply voltage.

11. The receiver apparatus of claim 1, further comprising any one or more of a digital signal processor, a programmable logic device, a field programmable gate array, a microprocessor, a microcontroller or a digital application specific integrated circuit (ASIC).

12. A receiver apparatus for receiving data from a memory device, the apparatus comprising:
a first resistor wherein a first terminal of the first resistor is connected to a first receiver input of the memory receiver apparatus;
a first N-type metal oxide semiconductor (NMOS) field effect transistor (FET) wherein a drain terminal of the first NMOS FET is connected to a second terminal of the first resistor and a gate terminal of the first NMOS FET is connected to the drain terminal of the first NMOS FET;
a second NMOS FET wherein a gate terminal of the second NMOS FET is connected to the gate terminal of the first NMOS FET;
a trans-impedance amplifier wherein an input terminal of the trans-impedance amplifier is connected to a drain terminal of the second NMOS FET;
a complementary metal oxide semiconductor (CMOS) inverter wherein an input terminal of the CMOS inverter is connected to an output terminal of the trans-impedance amplifier;
a first switch connected between the second terminal of the first resistor and the drain terminal of the first NMOS FET;
a second resistor wherein a first terminal of the second resistor is connected to a voltage reference (VREF) terminal that is configured to indicate a common mode of the first receiver input; and
a second switch wherein a first terminal of the second switch is connected to a second terminal of the second resistor and a second terminal of the second switch is connected to the drain terminal of the first NMOS FET, wherein the first NMOS FET and the second NMOS FET are low voltage devices; and wherein the first resistor is configured to shield the first NMOS FET and the second NMOS FET from input/output (I/O) voltage levels.

13. The receiver apparatus of claim 12, further comprising:
a first current source connected to the drain terminal of the first NMOS FET; and
a second current source connected to the drain terminal of the second NMOS FET.

14. The receiver apparatus of claim 13, wherein the first current source is configured to maintain the first NMOS transistor in active mode when the first receiver input is low.

15. The receiver apparatus of claim 14, wherein the second current source is configured to set a decision threshold voltage of the first receiver input; and
wherein the data output terminal is configured to switch when a voltage at the first receiver input exceeds the decision threshold.

16. The receiver apparatus of claim 12, further comprising:

a first switch connected between the second terminal of the first resistor and the drain terminal of the first NMOS FET;

a second resistor wherein a first terminal of the second resistor is connected to a voltage reference (VREF) terminal that is configured to indicate a common mode of the first receiver input; and a second switch wherein a first terminal of the second switch is connected to a second terminal of the second resistor and a second terminal of the second switch is connected to the drain terminal of the first NMOS FET.

17. The receiver apparatus of claim 16, further comprising control circuitry configured to calibrate a decision threshold of the first receiver input to be the common mode.

18. The receiver apparatus of claim 16, wherein the first switch and the second switch are implemented with CMOS transmission gates comprising I/O FETs.

19. The receiver apparatus of claim 16, further comprising:

a third resistor wherein a first terminal of the third resistor is connected to a voltage reference (VREF) terminal that is configured to indicate a common mode of the first receiver input;

a third switch wherein a first terminal of the third switch is connected to a second terminal of the third resistor and a second terminal of the third switch is connected to the drain terminal of the second NMOS FET;

a fourth resistor where in a first terminal of the fourth resistor is connected to a second receiver input of the receiver apparatus; and a fourth switch wherein a first terminal of the fourth switch is connected to a second terminal of the third resistor and a second terminal of the third switch is connected to the drain terminal of the second NMOS FET, wherein the first receiver input and the second receiver input are configured to receive a differential signal.

20. The receiver apparatus of claim 12, wherein the trans-impedance amplifier comprises:

a P-channel metal oxide semiconductor (PMOS) FET configured to source current to the output terminal of the trans-impedance amplifier wherein a gate terminal of the PMOS FET is connected to the input terminal of the trans-impedance amplifier;

a third NMOS FET configured to sink current from the output terminal of the trans-impedance amplifier wherein a gate terminal of the NMOS FET is connected to the input terminal of the trans-impedance amplifier; and a resistor connected in a feedback configuration between the input terminal of the trans-impedance amplifier and the output terminal of the trans-impedance amplifier.

* * * * *